United States Patent [19]

Larson et al.

[11] Patent Number: 5,216,572
[45] Date of Patent: Jun. 1, 1993

[54] STRUCTURE AND METHOD FOR INCREASING THE DIELECTRIC CONSTANT OF INTEGRATED FERROELECTRIC CAPACITORS

[75] Inventors: William Larson; Paul J. Schuele, both of Colorado Springs, Colo.

[73] Assignee: Ramtron International Corporation, Colorado Springs, Colo.

[21] Appl. No.: 853,901

[22] Filed: Mar. 19, 1992

[51] Int. Cl.$^5$ .............. H01G 4/06; H01G 9/00; H01G 7/00; G11C 11/22
[52] U.S. Cl. .................. 361/313; 29/25.42; 365/145; 257/295
[58] Field of Search .............. 29/25.42; 357/23.6, 357/51; 361/311–313, 303–305, 321; 365/145; 437/60; 264/61, 65

[56] References Cited

U.S. PATENT DOCUMENTS

| | | | |
|---|---|---|---|
| 4,437,139 | 3/1984 | Howard | 361/313 |
| 4,589,056 | 5/1986 | Stimmell | 361/311 |
| 5,046,043 | 9/1991 | Miller et al. | 365/145 |
| 5,119,154 | 6/1992 | Gnadinger | 357/51 X |
| 5,122,477 | 6/1992 | Wolters et al. | 437/60 |
| 5,122,923 | 6/1992 | Matsubara et al. | 361/321 |

*Primary Examiner*—Donald A. Griffin
*Attorney, Agent, or Firm*—Edward D. Manzo; Mark J. Murphy

[57] ABSTRACT

A ferroelectric capacitor for use in integrated circuits and having an asymmetric operation. The capacitor has a bottom electrode, a layer of ferroelectric material over the bottom electrode, a dielectric spacer on the sides of the bottom electrode and ferroelectric material, and a top electrode over the layer of ferroelectric material. The bottom and top electrode are comprised of different materials. Alternatively, an ion implantation region is formed in the top surface of the layer of ferroeletric material. A method of forming the asymmetric ferroelectric capacitor is also disclosed.

21 Claims, 7 Drawing Sheets

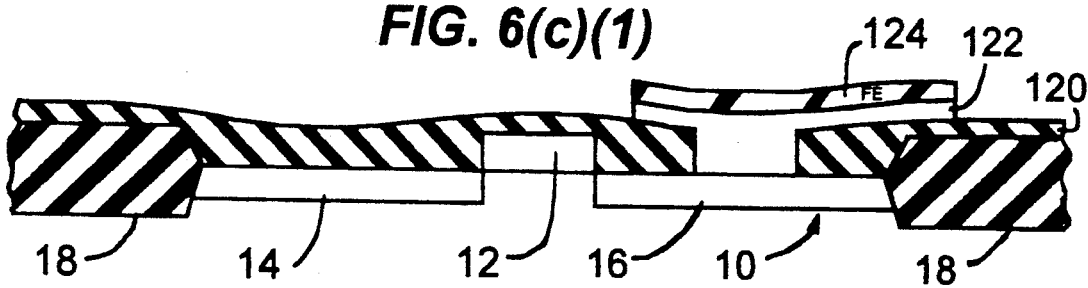
FIG. 6(c)(1)
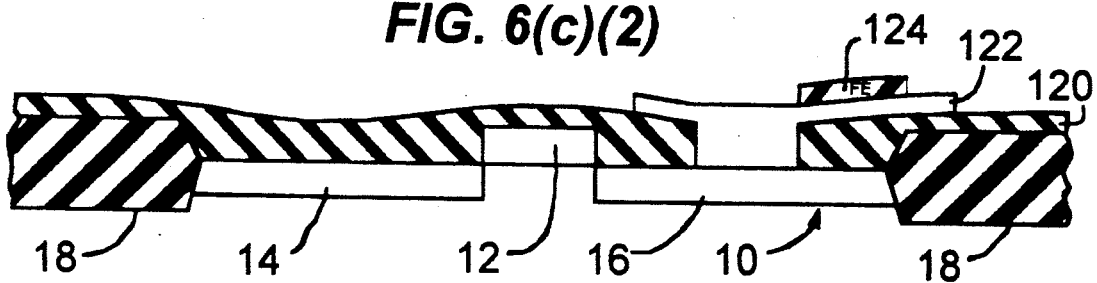
FIG. 6(c)(2)
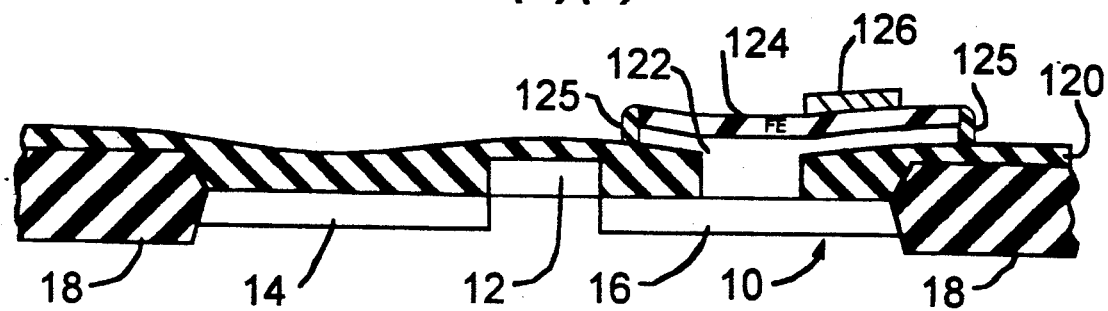
FIG. 6(d)(1)

FIG. 6(d)(2)

STRUCTURE AND METHOD FOR INCREASING THE DIELECTRIC CONSTANT OF INTEGRATED FERROELECTRIC CAPACITORS

BACKGROUND OF THE INVENTION

The present invention is directed to a ferroelectric capacitor for use as a storage element in a dynamic random access memory and in particular, to a ferroelectric capacitor having asymmetric operation.

One of the major objectives in the fabrication of integrated circuit capacitors, which are the principal storage elements in (volatile or non-volatile) dynamic random access memories (DRAMs), is to increase the charge storage capacity of the capacitor despite the reduction of the lateral dimensions of the capacitor, thereby to allow for the fabrication of higher density memory devices. Since capacitance is inversely proportional to separation between two capacitor plates, this capacitance increase was initially accomplished by reducing the thickness of the dielectric (which was typically silicon dioxide or silicon nitride) separating the two plates. However, these dielectrics have a low dielectric constant $\epsilon$ and are limited in how thin they can be fabricated.

As a result, compounds or compositions with high dielectric constants were investigated, capacitance being related (directly) to the dielectric constant of the material (if any) between the plates. Recently, ferroelectric materials have been proposed for use as the dielectric in these capacitors due to the high dielectric constant of many of the ferroelectric materials. Such a capacitor is disclosed in Ramtron Corporation's U.S. Pat. No. 5,005,102 (Larson '102) by William Larson, entitled "Multilayer Electrodes For Integrated Circuit Capacitors," the disclosure of which is incorporated herein by reference. The capacitor described in Larson '102 utilizes a ferroelectric material as the dielectric between the top and bottom electrodes. The top and bottom electrodes have plate layers which are comprised of the same material. The result is a symmetrical ferroelectric capacitor.

An alternative approach is disclosed in U.S. Ser. No. 07/491,180 filed Mar. 9, 1990 entitled "Charge Magnified DRAM Cell" in the name of S. Sheffield Eaton. Jr., now U.S. Pat. No. 5,109,357. That approach is different because among other things, it uses relaxation properties of a ferroelectric material positioned as the capacitor dielectric, so that repeated reading/writing of the device gives a unique benefit beyond what is ordinarily gained.

The object of the present invention is to provide an asymmetric ferroelectric capacitor which has a greater charge storage capacity than the prior, symmetrical devices, but without having to reduce the thickness of the dielectric.

SUMMARY OF THE INVENTION

The present invention, in one of its aspects, is directed to a ferroelectric capacitor having asymmetric operation for use in a dynamic random access memory. The asymmetric operation results, in one embodiment of the present invention, by having the top and bottom electrodes of the ferroelectric capacitor comprised of different materials.

The present invention is further directed to a method for forming an asymmetric ferroelectric capacitor. In general, the method comprises a series of deposition and defining steps to form an asymmetric ferroelectric capacitor having top and bottom electrodes comprised of different materials.

BRIEF DESCRIPTION OF THE DRAWINGS

In describing the preferred embodiment, reference is made to the accompanying drawings wherein like parts have like reference numerals and wherein:

FIG. 6(c)(1) shows the structure of FIG. 6(b) wherein the bottom electrode and dielectric have been simultaneously etched;

FIG. 6(c)(2) shows the structure of FIG. 6(b) wherein the bottom electrode and dielectric are separately defined;

FIG. 6(d)(1) shows the structure of FIG. 6(c)(1) with a defined top electrode over the dielectric and a dielectric spacer on the sides of the bottom electrode and the dielectric;

FIG. 6(d)(2) shows the structure of FIG. 6(c)(2) with a defined top electrode over the dielectric and a dielectric spacer on the sides of the bottom electrode and dielectric.

DETAILED DESCRIPTION OF PRESENTLY PREFERRED EMBODIMENTS

Figure 1:
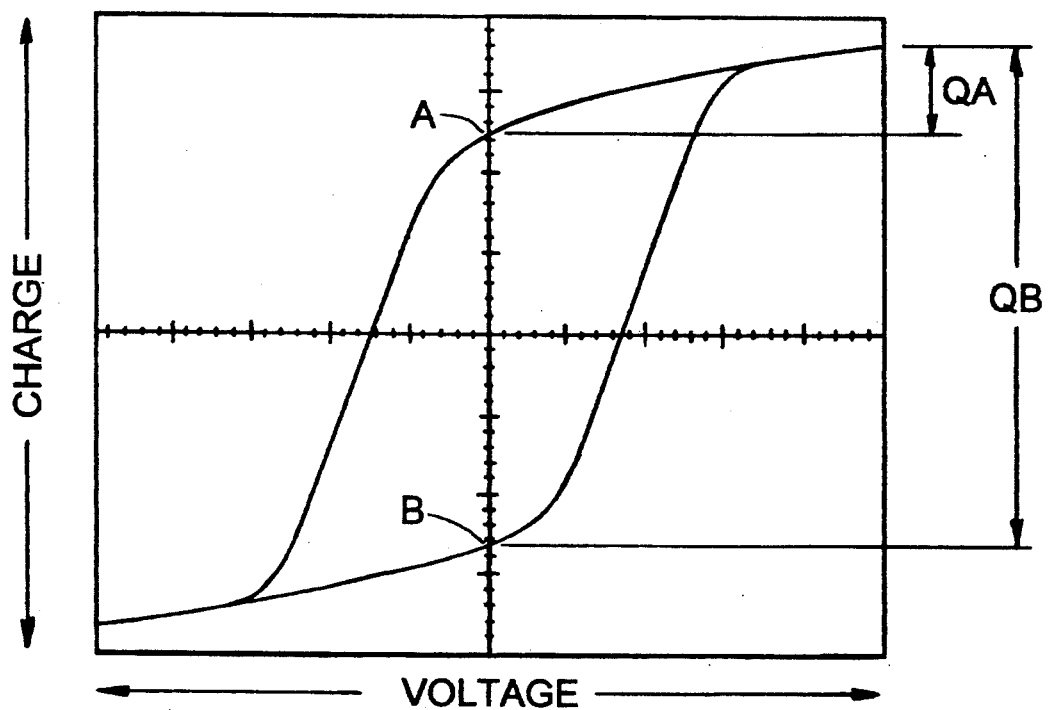
FIG. 1 shows a hystersis curve for a symmetrical capacitor.

FIG. 1 illustrates a typical hysteresis loop for a known symmetrical ferroelectric capacitor. A "ferroelectric capacitor" is a capacitor employing a ferroelectric material as (all or part of) its dielectric. When the capacitor is biased (i.e., the bottom electrode is grounded and the top electrode is positively biased), the charge storage of the capacitor at a given voltage is determined by the initial state of the capacitor, either state A or state B. The capacitor charge is then either QA or QB, as shown in FIG. 1. The higher charge, QB, is associated with polarization reversal of the capacitor and is known as the polarization charge. In DRAM applications, this charge is not used since repeated use of this state leads to fatigue or wear out of the capacitor. Instead, the charge QA, known as the linear charge, is used since n polarization reversal or wear-out will occur with repeated use.

Figure 2:
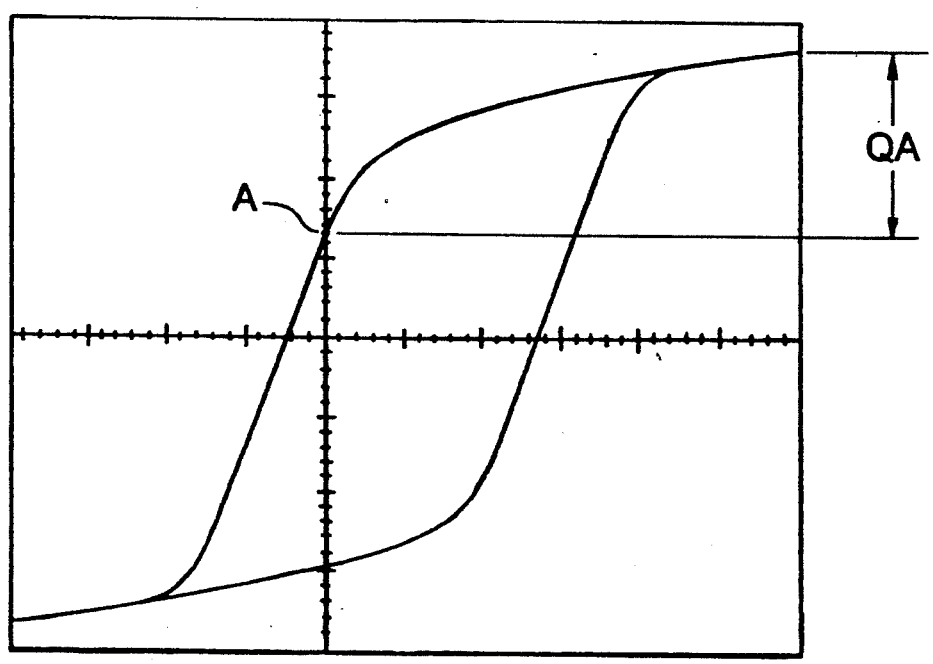
FIG. 2 shows a hystersis curve for an asymmetrical capacitor having a bias on the top electrode with the bottom electrode being grounded.

FIG. 2 illustrates a hystersis loop for a similar type of capacitor as that used for FIG. 1 except that the capacitor in FIG. 2 is an asymmetric ferroelectric capacitor. Note that while the shape of the loop is like that of FIG. 1, it is not symmetric around the origin, but is shifted to the right. The asymmetry can be induced by using different materials for the top and bottom electrodes, as in the present invention. As a result of the asymmetry of the capacitor, the linear charge QA in FIG. 2 is much larger than the linear charge QA in the symmetrical capacitor in FIG. 1. Since the charge in the asymmetrical capacitor is larger, the capacitor can be made smaller which is necessary for producing higher density memories.

Figure 3:
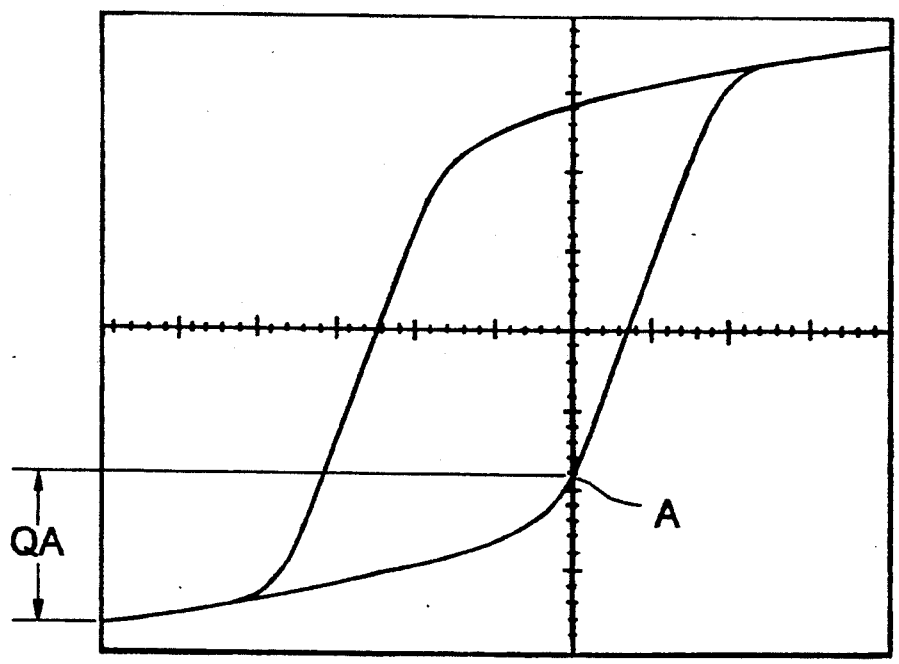
FIG. 3 shows a hystersis curve for an asymmetrical capacitor having a bias on the bottom electrode with the top electrode being grounded.

FIG. 3 illustrates a hysteresis loop for an asymmetrical capacitor wherein the bottom electrode is positively biased and the top electrode is grounded. As in the capacitor used for FIG. 2, asymmetry can also be produced in this capacitor by using different materials for the top and bottom electrodes. The linear charge QA of this capacitor would also be larger than the charge in a symmetrical capacitor.

Figure 4A:
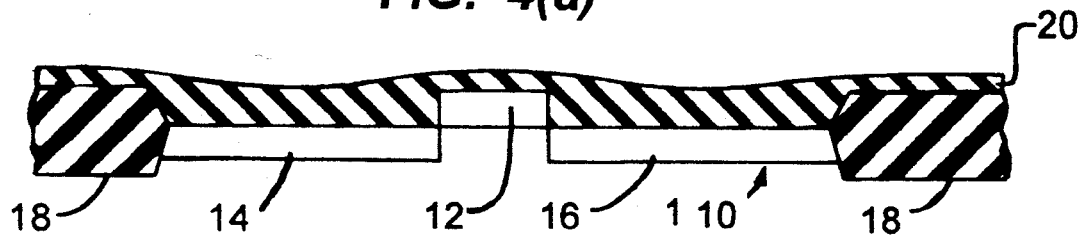
FIG. 4(a) shows a cross-sectional view of a portion of an integrated circuit according to an embodiment of the present invention wherein an insulating layer is over an integrated circuit transistor.

FIGS. 4(a)-4(g) illustrate a method for fabricating a first embodiment of a capacitor according to the present invention. The capacitor may be constructed upon or over a substrate or other element of an integrated circuit. In FIG. 4, we show the improved capacitor constructed on a field effect transistor, to which the capacitor may be coupled. Such a transistor is not necessary for the present invention, however, and is shown only illustratively. In FIG. 4(a), an integrated circuit transistor 10 is fabricated. The integrated circuit transistor can be fabricated by using silicon CMOS, silicon bipolar or GaAs technology. A field effect transistor (FET) is shown for illustrative purposes. In a preferred embodiment, a N-channel enhancement mode MOSFET is used a transistor 10. FET 10 comprises a gate electrode 12, a first source/drain region 14, and a second source/drain region 16. Gate electrode 12 may comprise any of a variety of substances, including but not limited to doped polysilicon, metal, a "polycide," or any combination thereof. "Polycide" refers to a combined structure having polysilicon and a refractory metal silicide. Isolation regions 18, such as field oxide, may be included. The bulk of the substrate is not shown, but will be understood to reside below regions 14, 16 and 18. As shown in FIG. 4(a), an insulating layer 20 is established, by deposition or an oxidation process or otherwise, over transistor 10. Layer 20 is preferably comprised of silicon dioxide, silicon nitride or some combination thereof, and has a typical thickness in the range of 1,000 Å to 10,000 Å. It could also comprise PSG or BPSG.

Figure 4B:
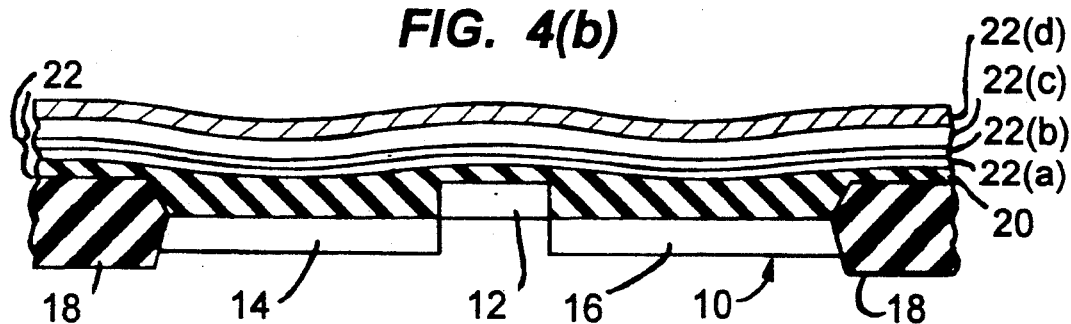
FIG. 4(b) shows the structure of FIG. 4(a) with a bottom electrode over the insulating layer.

A bottom electrode 22 for the capacitor is established over layer 20, as shown in FIG. 4(b). Bottom electrode 22 can comprise a single layer or multiple layers.

One embodiment of the present invention wherein multiple layers are utilized for the bottom electrode is shown in FIG. 4(b). In this embodiment, a first layer 22(a) is established over layer 20 and preferably comprises an adhesion layer composed preferably of titanium. Layer 22(a) promotes adhesion of the bottom electrode to the substrate. On top of first layer 22(a), a second layer 22(b) is established. Second layer 22(b) preferably comprises a diffusion barrier layer formed by titanium nitride. The diffusion barrier layer prevents an upper or further layer of material from diffusing or migrating into the lower layers. A third layer 22(c) is then established over second layer 22(b) and can act as an electrical contact layer which electrically connects the capacitor of the present invention to other devices and components on the integrated circuit. Layer 22(c) preferably comprises tungsten. A top layer 22(d), also known as a plate layer, is then established over layer 22(c). In the preferred embodiment, top layer 22(d) (or the entire bottom electrode if a single layer is used) is comprised of platinum. The platinum can be established by sputtering or evaporation, for example, and has a thickness in the range of between 500 Å (50 nm) to 5,000 Å (500 nm).

Figure 4C:
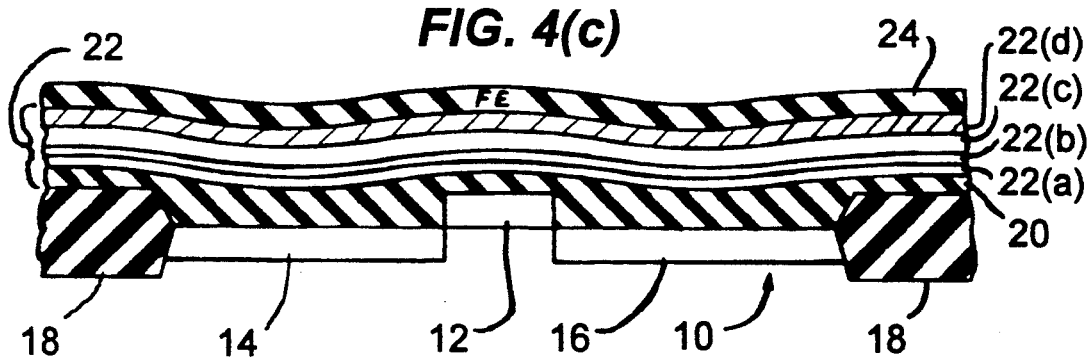
FIG. 4(c) shows the structure of FIG. 4(b) with a dielectric over the bottom electrode.

A dielectric layer 24 is then established over bottom electrode 22, as shown in FIG. 4(c). Dielectric layer 24 is preferably comprised of a ferroelectric material. The ferroelectric material can comprise a compound of lead, zirconate and titanate, known to the art as "PZT" and having a general formula $Pb(Ti_xZr_{1-x})O_3$. The $Pb(Ti_xZr_{1-x})O_3$ stoichiometry can be in the range from $X=0.20$ to $X=1.0$. In addition, dopants such as lanthanum (La) or niobium (Nb) can be added to the ferroelectric material in the range of 0.5% to 10% atomic percentage. Dielectric layer 24 can be established by sputtering, evaporation, sol-gel, or chemical vapor deposition (CVD) and has a preferred thickness in the range of between 500 Å (50 nm) to 5,000 Å (500 nm).

The ferroelectric material layer 24 is then annealed so that it enters a perovskite phase. The material can be annealed using a rapid thermal annealing process (RTA) or furnace annealing for a period of seconds (for RTA) or three hours or thereabouts (for furnace). Preferably, a furnace anneal is done at a temperature of between 500° C. to 800° C.

Figure 4D:
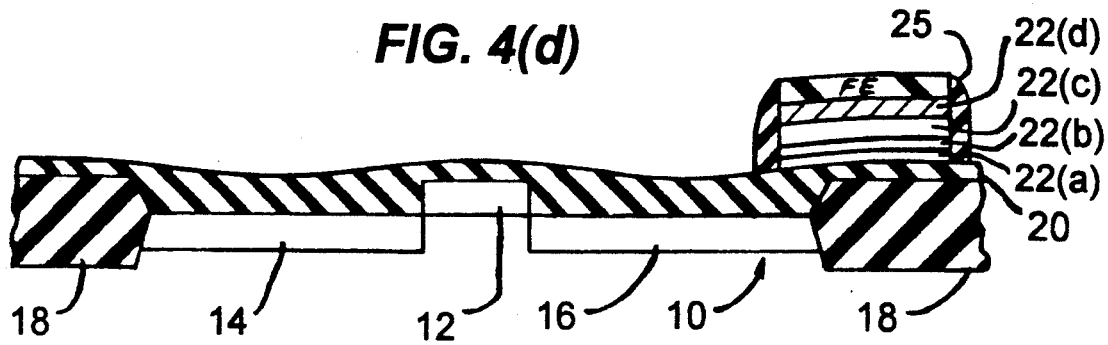
FIG. 4(d) shows the structure of FIG. 4(c) with a dielectric spacer on the sides of the bottom electrode and the dielectric.

Bottom electrode 22 and dielectric layer 24 are then defined and etched using conventional integrated circuit (IC) photolithography and etching techniques. A dielectric spacer 25 is then deposited over and around bottom electrode 22 and dielectric 24. Spacer 25 can be comprised of silicon dioxide and has a thickness of between 1000 Å to 3000 Å. Spacer 25 is then etched using an anisotropic etch so that it remains only on the sides of bottom electrode 22 and dielectric 24, as shown in FIG. 4(d). The etch times should be controlled so that only the thickness of the spacer is removed.

Figure 4E:
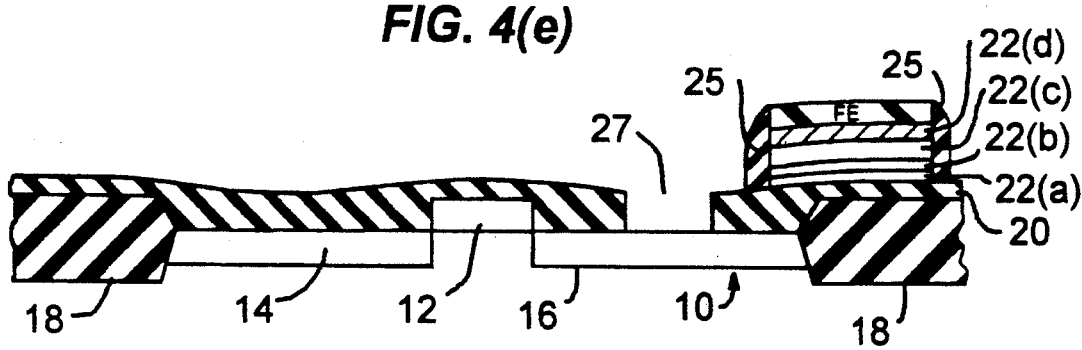
FIG. 4(e) shows the structure of FIG. 4(d) with a contact window established through the insulating layer to the source region.

Next, a contact window 27 is established through insulation layer 20 to source/drain region 16, as shown in FIG. 4(e). Contact window 27 can be established through the use of conventional photolithography and etching techniques.

Figure 4F:
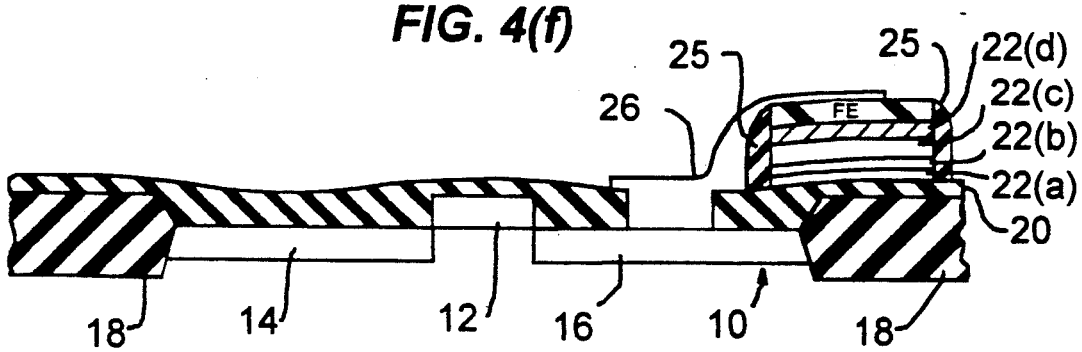
FIG. 4(f) shows the structure of FIG. 4(e) with a top electrode over the dielectric and in the contact window.

A top electrode 26 is then established over dielectric 24 and in contact window 27 as shown in FIG. 4(f). Top electrode 26 comprises a different material than that used in top layer 22(d) (or bottom electrode 22 if only a single layer bottom electrode is utilized) in order to create an asymmetric capacitor. Preferably, electrode 26 is comprised of either palladium (Pd), ruthenium (Ru), indium-tin oxide (ITO), rhenium (Rh), tungsten metal silicides or refractory metal nitrides and has a thickness in a range of between 500 Å (50 nm) to 5,000 Å (500 nm).

Figure 4G:
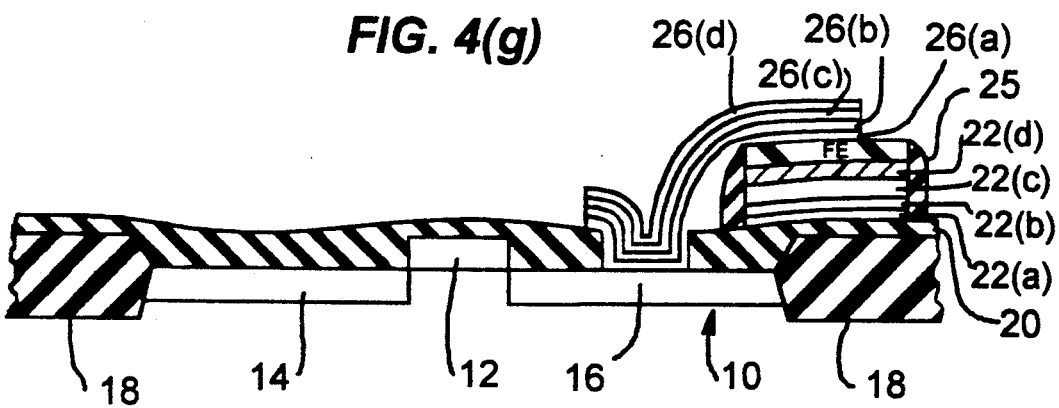
FIG. 4(g) shows the structure of FIG. 4(e) with a top electrode comprised of multiple layers over the dielectric and in the contact window

In a variation of this embodiment, as shown in FIG. 4(g), top electrode 26 can be comprised of multiple layers, such as a plate layer 26(a), a diffusion barrier 26(b) and an electrical contact 26(c) for example. Plate layer 26(a) is comprised preferably of either pallidium, ruthenium, indium-tin oxide, rhenium, tungsten metal silicides, or refractory metal nitrides. Diffusion layer 26(b) can be comprised of titanium, for example. Electrical contact 26(c) can be comprised of aluminum, for example.

Figure 5:
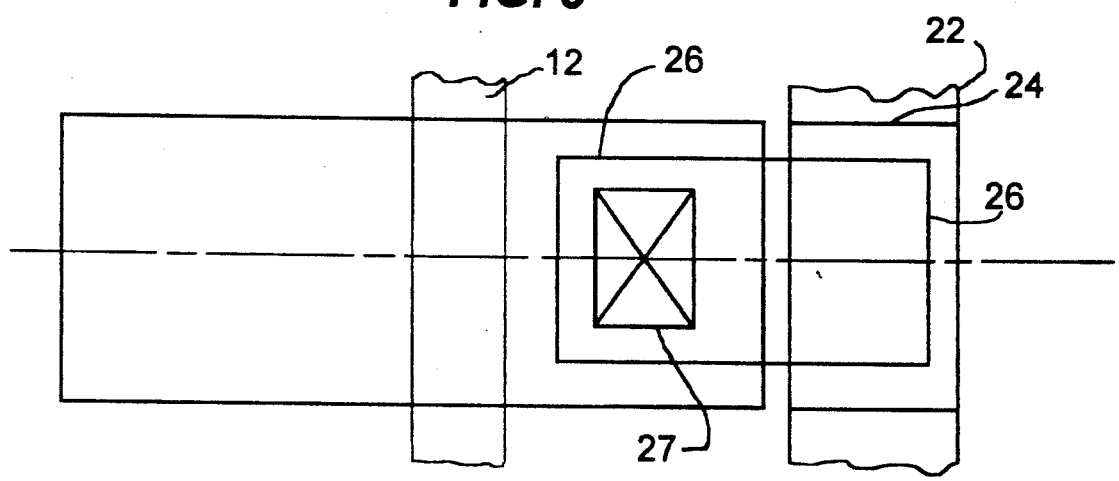
FIG. 5 shows a plan view of the capacitor of the first embodiment of the present invention.

FIG. 5 shows a plan view of the structure of the capacitor and transistor structure of FIG. 4, and depicts contact window 27 wherein top electrode 26 makes contact with the underlying transistor. The word line (WL) forms gate electrode 12. In this embodiment, top electrode 26 is always held at ground. Bottom electrode 22 would then be biased through the transistor during cell operation.

Figure 6A:
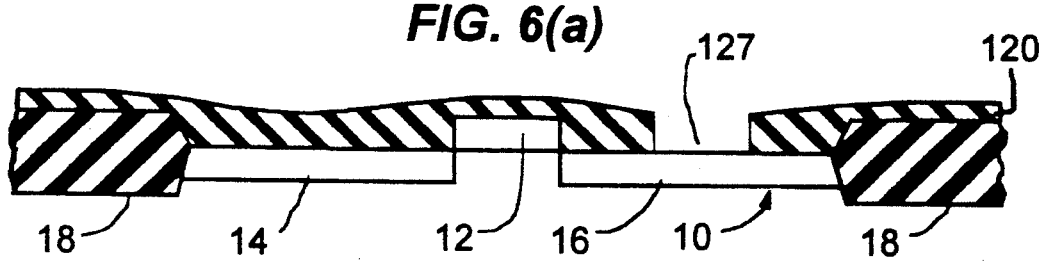
FIG. 6(a) shows a cross-sectional view of a portion of an integrated circuit according to a second embodiment of the present invention wherein an insulating layer is over an integrated circuit transistor and a contact window is formed in the insulating layer.

In a second embodiment of the present invention, the integrated circuit can be constructed so that the bottom electrode is positively biased and the top electrode is grounded. This results in the capacitor electrode structure being inverted. In this embodiment, as shown in FIG. 6(a) a contact window 127 is established in insulating layer 120. Window 127 can be established through the use of conventional photolithography and etching techniques.

Figure 6B:
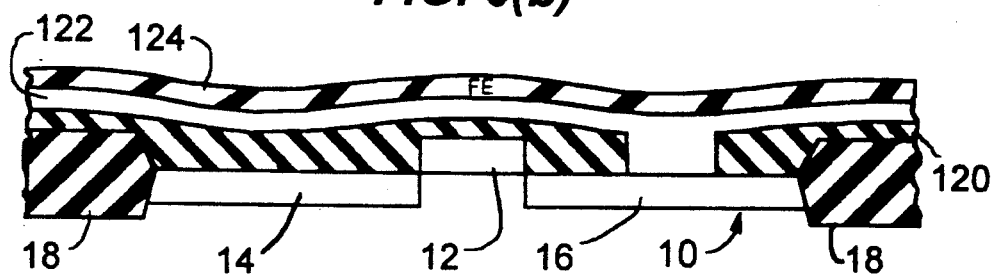
FIG. 6(b) shows the structure of FIG. 6(a) with a bottom electrode and a dielectric formed over the insulating layer.

A bottom electrode 122 is then established over insulating layer 120 and in window 127. A dielectric layer 124 is established over electrode 122 as shown in FIG. 6(b). The two layers are then annealed. Electrode 122 and dielectric layer 124 are established and annealed in a manner similar to that disclosed in the first embodiment. Bottom electrode 122 can be comprised of palladium, ruthenium, indium-tin oxide, rhenium, tungsten metal silicides, or refractory metal nitrides and has a thickness in the range of between 500 Å (50 nm) to 5,000 Å (500 nm). In variation of this embodiment, bottom electrode 122 can be comprised of multiple layers as described supra for top electrode 26 in the first embodiment. Dielectric layer 124 is preferably a ferroelectric material, such as the "PZT" used in the first embodiment.

Bottom electrode 122 and dielectric layer 124 are then patterned and etched. Electrode 122 and dielectric layer 124 can be defined simultaneously, as shown in FIG. 6(c)(1). In a variation of this embodiment, first dielectric layer 124 is defined, then electrode 122 is defined, as shown in FIG. 6(c)(2).

Bottom electrode 122 and dielectric 124 are patterned and etched using conventional integrated circuit (IC) photolithography and etching techniques. A dielectric spacer 125 is then deposited over and around bottom electrode 122 and dielectric 124. Spacer 125 is then etched so that it remains only on the sides of bottom electrode 122 and dielectric layer 124. Spacer 25 can be comprised of silicon dioxide and has a thickness of between 1000 Å to 3000 Å.

A top electrode 126 is then established over dielectric 124 and is defined using conventional photolithography and etching techniques, as shown in FIGS. 6(d)(1) and 6(d)(2). Top electrode 126 is preferably comprised of platinum and has a thickness between 500 Å (50 nm) and 5,000 Å (500 nm). In another variation of this embodiment, top electrode 126 can be comprised of multiple layers as described supra for bottom electrode 22 in the first embodiment.

Figure 7:
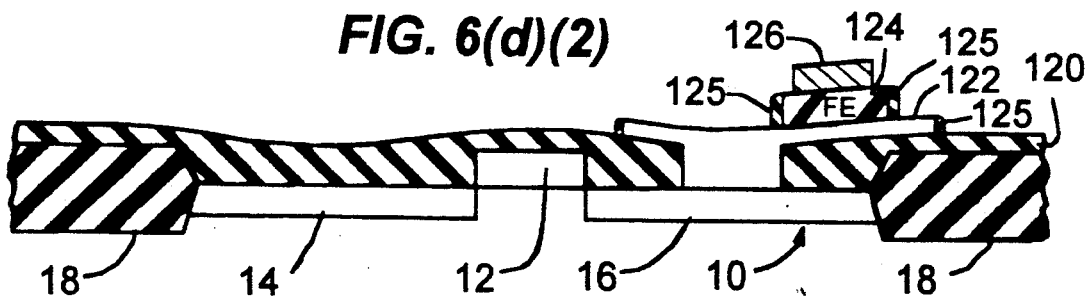
FIGS. 7 and 8 show cross-sectional views of the structure of a third embodiment of the present invention.
Figure 7:
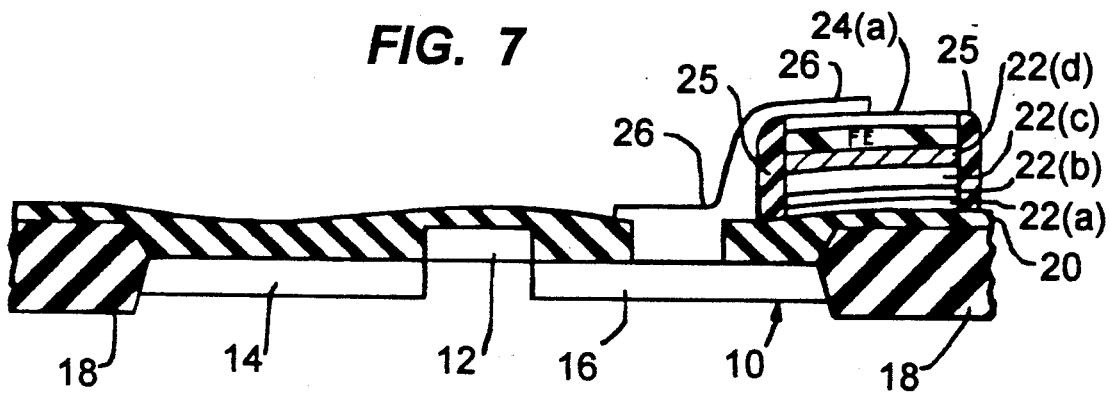
Figure 8:
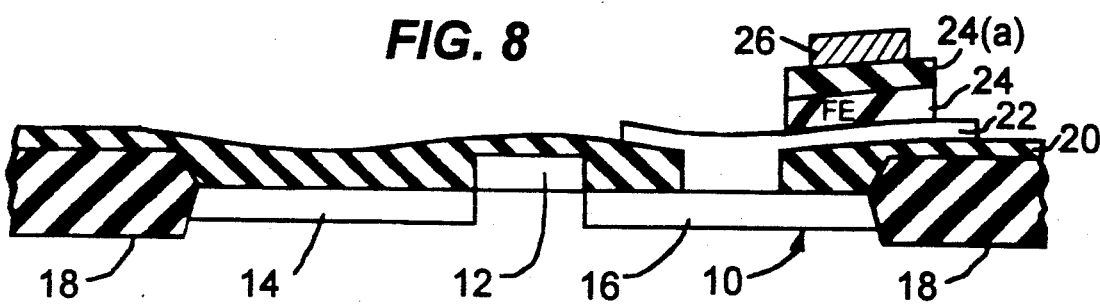

In the method for forming the third embodiment of the present invention, as shown in FIGS. 7 and 8, an integrated circuit 10, insulating layer 20, bottom electrode 22 and dielectric 24 are formed in a manner similar to that described for the method for forming the first or second embodiments. The dielectric layer is then annealed as described previously.

An ion implantation of the top surface of the ferroelectric material of the dielectric is then conducted to form implanted region 24a. An ion species, for example a heavier atomic weight inert gas such as argon or krypton, oxygen, or a halogen gas such as chlorine, fluorine or bromine, could be used in the ion implantation. The ion implantation can be performed using standard integrated circuit production ion implantation equipment. As a result of the ion implantation, the electrical characteristics of the capacitor will change. Top electrode 26 is then established over dielectric 24 and implanted region 24a. Electrode 26 can be similar to the top electrodes previously described in the other embodiments of the present invention.

An asymmetric capacitor results due to atomic level modifications of the ferroelectric material that result from the ion implantation. In particular, controlling the acceleration voltage and ion dose will cause asymmetry to occur. The acceleration voltage will affect the depth of the atomic disorder in the PZT while the ion dose will affect the amount of disorder. As a result of asymmetry being formed by the ion implantation, the top and bottom electrodes in this embodiment can comprise the same material. FIGS. 7 and 8 show a cross-sectional view of two examples of a structure for this embodiment.

This description has been offered for illustrative purposes only and is not intended to limit the invention of this application, which is defined in the claims below.

We claim:

1. An asymmetric capacitor for an integrated circuit comprising:
    a bottom electrode with sides;
    a layer of ferroelectric material, with sides, located over said bottom electrode;
    a silicon dioxide dielectric spacer located on said sides of said bottom electrode and said layer of ferroelectric material; and
    a top electrode located over said layer of ferroelectric material, said top electrode comprising a material different than that in said bottom electrode.

2. A capacitor according to claim 1 wherein said bottom electrode is comprised of platinum.

3. A capacitor according to claim 2 wherein said top electrode is comprised of an element selected from the group comprising palladium, ruthenium, indium-tin oxide, rhenium, tungsten metal silicides and refractory metal nitrides.

4. A capacitor according to claim 1 wherein said bottom electrode is comprised of an element selected from the group comprising palladium, ruthenium, indium-tin oxide, rhenium, tungsten metal silicides and refractory metal nitrides.

5. A capacitor according to claim 4 wherein said top electrode is comprised of platinum.

6. A capacitor according to claim 1 wherein said bottom electrode comprises an adhesion layer, a diffusion barrier layer over said adhesion layer, an electrical contact layer over said diffusion barrier layer, and a plate layer over said electrical contact layer.

7. A capacitor according to claim 6 wherein said top electrode is comprised of a different material than said plate layer.

8. A capacitor according to claim 7 wherein said top electrode is comprised of an element selected from the group comprising palladium, ruthenium and indium-tin oxide, and said plate layer is comprised of platinum.

9. A capacitor according to claim 1 wherein said layer of ferroelectric material is comprised of a compound having the general formula $Pb(Ti_xZr_{1-x})O_3$ wherein $X=0.2$ to $X=1.0$.

10. A capacitor according to claim 1 wherein said bottom electrode is located over a transistor which is formed in or upon a substrate, and said bottom electrode is insulated from said transistor.

11. A capacitor according to claim 1 wherein said layer of ferroelectric material has a top surface and an ion implantation region is located in said top surface of said layer of ferroelectric material.

12. A method for forming an asymmetric ferroelectric capacitor, said method comprising the steps of:
   establishing a bottom electrode, with sides;
   establishing a layer of ferroelectric material, with sides, over said bottom electrode, said layer of ferroelectric material having a top surface and a bottom surface;
   establishing a dielectric spacer around said bottom electrode and said layer of ferroelectric material and etching said dielectric spacer so that said spacer is located on the sides of said bottom electrode and said layer of ferroelectric material; and
   establishing a top electrode, comprised of a different material then said bottom electrode, over said layer of ferroelectric material.

13. A method according to claim 12 further comprising the step of establishing an ion implantation region in said top surface of said layer of ferroelectric material.

14. A method according to claim 12 further comprising the step of defining said top electrode, said layer of ferroelectric material and said bottom electrode.

15. A method according to claim 12 further comprising the step of annealing said layer of ferroelectric material.

16. A method for forming a capacitor in an integrated circuit, said method comprising the steps of:
   forming a transistor having a gate electrode, a source region and a drain region;
   establishing an insulation layer over said transistor;
   establishing a bottom electrode over said insulation layer;
   establishing a layer of ferroelectric material over said bottom electrode;
   defining said bottom electrode and said layer of ferroelectric material so that said bottom electrode and said layer of ferroelectric material have sides;
   establishing a dielectric spacer on the sides of said bottom electrode and said layer of ferroelectric material;
   defining a contact window in said insulating layer to said source region; and
   establishing a top electrode over said layer of ferroelectric material and said bottom electrode and in said contact window.

17. A method according to claim 16 further comprising the step of establishing an ion implantation region in said top surface of said layer of ferroelectric material.

18. A method for forming a capacitor in an integrated circuit, said method comprising the steps of:
   forming a transistor having a gate electrode, a source region and a drain region;
   establishing an insulation layer over said transistor;
   defining a contact window in said insulating layer to said source region;
   establishing a bottom electrode over said insulation layer and in said contact window;
   establishing a layer of ferroelectric material over said bottom electrode;
   defining said bottom electrode and said layer of ferroelectric material so that only said bottom electrode is in said contact window and said bottom electrode and said layer of ferroelectric material have sides;
   establishing a dielectric spacer on the sides of said bottom electrode and said layer of ferroelectric material; and
   establishing a top electrode over said layer of ferroelectric material and said bottom electrode and in said contact window.

19. A method according to claim 18 further comprising the step of establishing an ion implantation region in a top surface of said layer of ferroelectric material.

20. An asymmetric capacitor for an integrated circuit comprising:
   a transistor having a gate electrode, a source region and a drain region;
   an insulating layer over said transistor;
   a bottom electrode, with sides, is located over said insulating layer and in a contact window in said insulating layer to said source region;
   a layer of ferroelectric material located over said bottom electrode, said layer of ferroelectric material having sides, a top surface and a bottom surface;
   a dielectric spacer located on said sides of said bottom electrode and said layer of ferroelectric material; and
   a top electrode located over said top surface of said layer of ferroelectric material.

21. A capacitor according to claim 20 further comprising an ion implantation region located in a top surface of said layer of ferroelectric material.

* * * * *